United States Patent
Chen

(10) Patent No.: US 9,112,418 B2
(45) Date of Patent: Aug. 18, 2015

(54) CONTROLLER FOR A SWITCHED MODE POWER SUPPLY HAVING AN INTEGRATED CIRCUIT WITH MULTIFUNCTION PIN

(71) Applicant: Grenergy Opto Inc., Hsin-Chu (TW)

(72) Inventor: Ren Yi Chen, Hsin-Chu (TW)

(73) Assignee: GRENERGY OPTO INC., Hsin-Chu (TW)

( * ) Notice: Subject to any disclaimer, the term of this patent is extended or adjusted under 35 U.S.C. 154(b) by 150 days.

(21) Appl. No.: 14/094,546

(22) Filed: Dec. 2, 2013

(65) Prior Publication Data

US 2015/0155787 A1 Jun. 4, 2015

(51) Int. Cl.
*H02M 3/335* (2006.01)
*H03K 17/22* (2006.01)

(52) U.S. Cl.
CPC ...... *H02M 3/33507* (2013.01); *H02M 3/33523* (2013.01); *H03K 17/22* (2013.01)

(58) Field of Classification Search
CPC ...................... H02M 3/33507; H02M 3/33523; H02M 1/32; H02M 3/33576
USPC .......................................................... 363/49
See application file for complete search history.

(56) References Cited

U.S. PATENT DOCUMENTS

| | | | |
|---|---|---|---|
| 2008/0272830 A1* | 11/2008 | Steedman et al. | 327/530 |
| 2009/0172383 A1* | 7/2009 | Cumming et al. | 713/2 |
| 2010/0302814 A1* | 12/2010 | Lu et al. | 363/21.01 |

* cited by examiner

*Primary Examiner* — Harry Behm
*Assistant Examiner* — Peter Novak
(74) *Attorney, Agent, or Firm* — McClure, Qualey & Rodack, LLP

(57) ABSTRACT

Disclosure includes a controller in an integrated circuit and a related switched mode power supply. The switched mode power supply has an input power line and a ground line. An inductive device and a power switch are connected in series between the input power line and the ground line. The controller has a multifunction pin and is configured for controlling the power switch. A resistor connects the multifunction pin to the input power line. During a startup procedure, the controller provides a first conduction path conducting from the multifunction pin to the ground line. During normal operation, the controller disconnects the first conduction path, and makes the multifunction pin an output node of an error amplifier comparing a regulated output with a target value, to generate a PWM signal for controlling the power switch.

17 Claims, 4 Drawing Sheets

CONTROLLER FOR A SWITCHED MODE POWER SUPPLY HAVING AN INTEGRATED CIRCUIT WITH MULTIFUNCTION PIN

BACKGROUND

The present disclosure relates generally to a switched mode power supply and more especially to a switched mode power supply with a multifunction pin.

A switched mode power supply commonly utilizes a power switch to control the current flowing through an inductive device. In comparison with other kinds of power supply, switched mode power supplies usually enjoy compact size and excellent conversion efficiency, and are accordingly popular in the art.

FIG. 1 demonstrates a conventional switched mode power supply 10 with a flyback topology. Bridge rectifier 20 performs full-wave rectification, converting the alternative-current (AC) power source from an AC mains outlet into a direct-current (DC) input source, and providing both an input voltage $V_{IN}$ at an input power line IN and a ground voltage at a ground line GND. The input voltage $V_{IN}$ could have an M-shaped waveform or be substantially a constant. Controller 26 is an integrated circuit with pins VCC, QRD, COMP, BNO/BOI, and GATE, connected to peripheral devices. Via pin GATE, power controller 26 provides a PWM signal $V_{GATE}$, periodically turning ON and OFF a power switch 34. When the power switch 34 is ON, a primary winding PRM of the transformer energizes. When it is OFF, the transformer de-energizes via a secondary winding SEC and an auxiliary winding AUX to build up an output voltage $V_{OUT}$ for load 24 and an operation voltage $V_{CC}$ for power controller 26.

A voltage divider consisting of resistors 28 and 30 detects voltage drop $V_{AUX}$ across the auxiliary winding AUX, to provide a quasi-resonance signal $V_{QRD}$ to pin QRD of controller 26, which could accordingly perform valley switching to reduce the switch loss in the power switch 34.

The regulation to output voltage $V_{OUT}$ could be achieved by accumulating the error between output voltage $V_{OUT}$ and an expected target voltage to modulate the duty cycle of the PWM signal $V_{GATE}$. Resistors 44 and 46 divide output voltage $V_{OUT}$ to provide a divided result, which LT431 uses to compare with an internal reference voltage, 2.5V for example, and to generate an error signal. Photo coupler 42 optically transmits, from a secondary side to a primary side, the error signal, which is accumulated over time at pin COMP on a compensation capacitor 50. A resistor 52 connected to operation power line VDD inside controller 26 provides a driving force to push up the compensation voltage $V_{COMP}$ while photo coupler 42 provides an opposite driving force to pull down the compensation voltage $V_{COMP}$. PWM generator 40 generates PWM signal $V_{GATE}$ in response to the compensation voltage $V_{COMP}$.

Resistors 53 and 54 are connected between the input power line IN and the ground line GND, for brownout and brownin detection. As known in the art, a brownout is an intentional or unintentional drop in voltage in an electrical power supply system, and this voltage reduction may be an effect of disruption of an electrical grid for example. A brownout could cause a switched mode power supply to malfunction if there is no corresponding protection. Controller 26 detects the input voltage $V_{IN}$ via pin BNO/BNI. If a brownout is found, controller 26 constantly turns off power switch 34, to shut down and protect the switched mode power supply 10. Here in this specification, a brownin refers to an increment in the input voltage $V_{IN}$ that controller 26 could resume to turn on and off power switch 34 periodically. The switched mode power supply 10 might shut down if the input voltage $V_{IN}$ is under a brownout voltage, 60V for example, and resume switching the power switch 34 if the input voltage $V_{IN}$ recovers to exceed a brownin voltage, 70V for example.

Even though the switched mode power supply 10 could accurately perform brownin and brownout detection, an extra pin BNO/BNI is necessary. Pin count is crucial in the art, as it largely determines the total cost of an integrated circuit. Accordingly, it is preferable to have a less pin count and keep the same functionalities as well at the same time for an integrated circuit.

BRIEF DESCRIPTION OF THE DRAWINGS

The invention can be more fully understood by the subsequent detailed description and examples with references made to the accompanying drawings, wherein.

DETAILED DESCRIPTION

Figure 2:
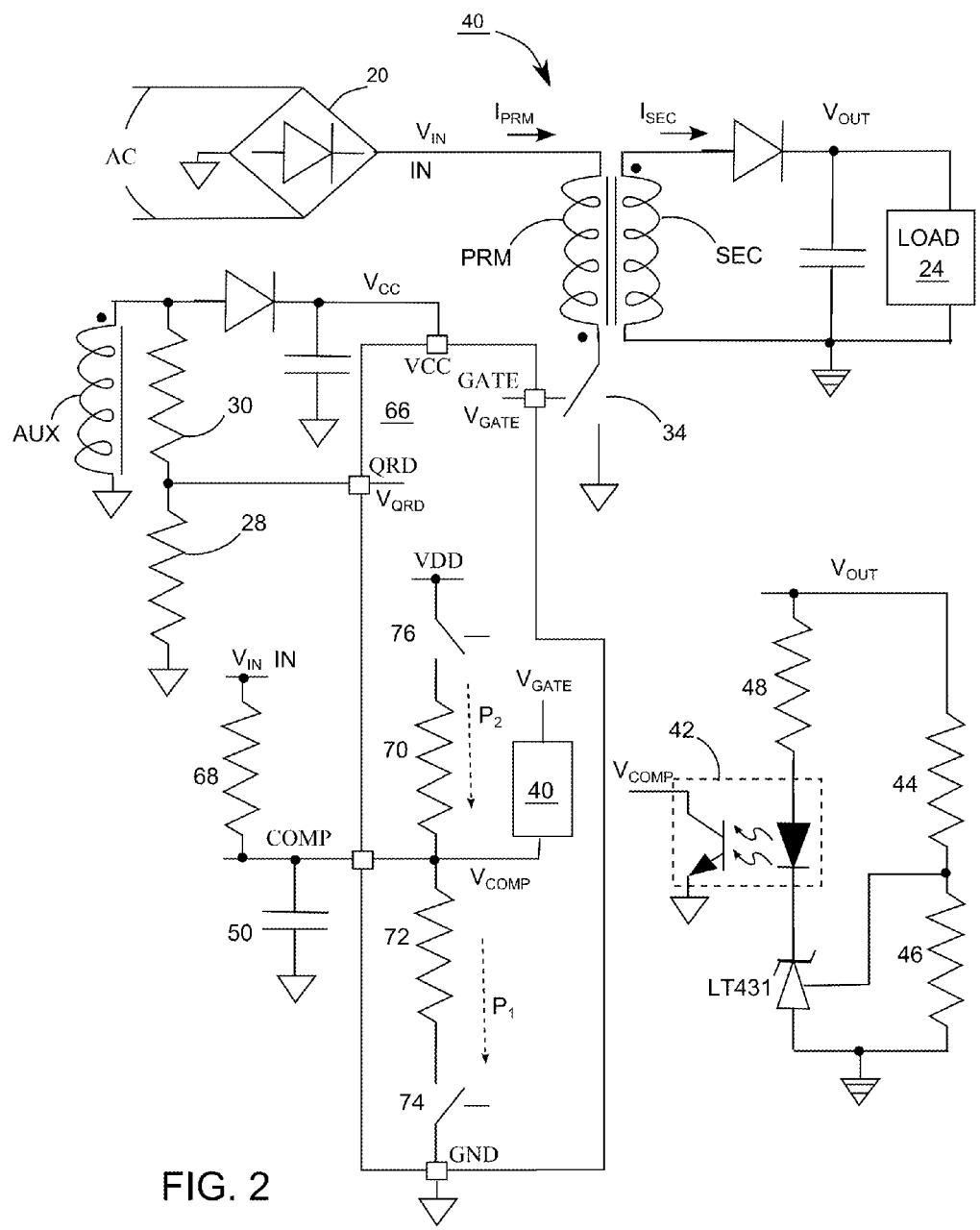
FIG. 2 demonstrates a switched mode power supply according to one embodiment of the invention.

The invention is exemplified by, but not limited to, flyback converters in this specification. FIG. 2 demonstrates a switched mode power supply 41 according to one embodiment of the invention, capable of performing brownin and brownout detection without the penalty of an extra pin, thereby saving cost. In one embodiment, the controller 66 is a monolithic integrated circuit packaged with pins, and performs brownout detection via pin QRD, and brownin detection via pin COMP. Pin COMP is a multifunction pin as it can be configured to become an output node of an error amplifier during normal operation.

Figure 1:
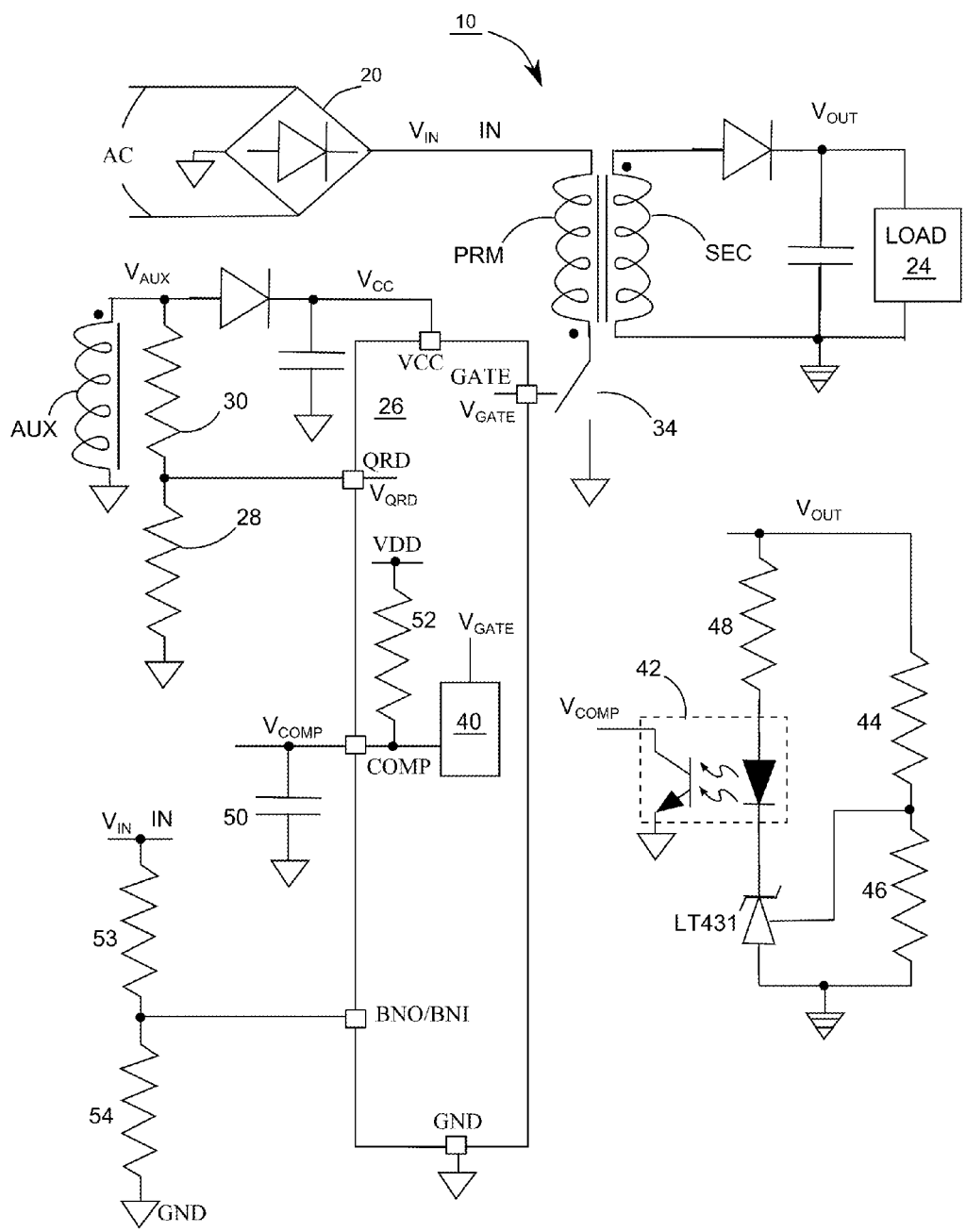
FIG. 1 demonstrates a conventional switched mode power supply with a flyback topology.

The switched mode power supply 41 has a lot of devices and elements with the same symbols as those shown in the switched mode power supply 10 in FIG. 1. Those having the same symbols are, but not limited to, the same in view of function or structure. The switched mode power supply 41 has no resistors 53 and 54, and pin BNO/BNI shown in FIG. 1, but has another resistor 68 connected between pin COMP and the input power line IN. In comparison with the controller 26 in FIG. 1, the controller 66 in FIG. 2 is one pin less, such that the controller 66 could be more cost-effective. As the switched mode power supply 41 has less resistors and a probably-cheaper controller 66 than the switched mode power supply 10 does, the BOM (bill of material) cost of FIG. 2 could be lower.

Inside the controller 66, a path switch 76 and a compensation resistor 70 are connected in series, to optionally provide a conduction path $P_2$ from the operation power line VDD to pin COMP, for charging the compensation capacitor 50. The operation power line VDD could be a regulated output of a low dropout (LDO) powered by the operation power line VCC. A path switch 74 and a detection resistor 72 are also connected in series, to optionally provide a conduction path $P_1$ from pin COMP to the ground line GND, for discharging the compensation capacitor 50. In one embodiment of the invention, only one of path switches 74 and 76 can be turned ON, performing a short circuit, at a time. When one path switch is turned ON, the other must be turned OFF, performing an open circuit. In other words, if one of conduction paths $P_1$ and $P_2$ is provided, the other is disconnected.

Figure 3A:
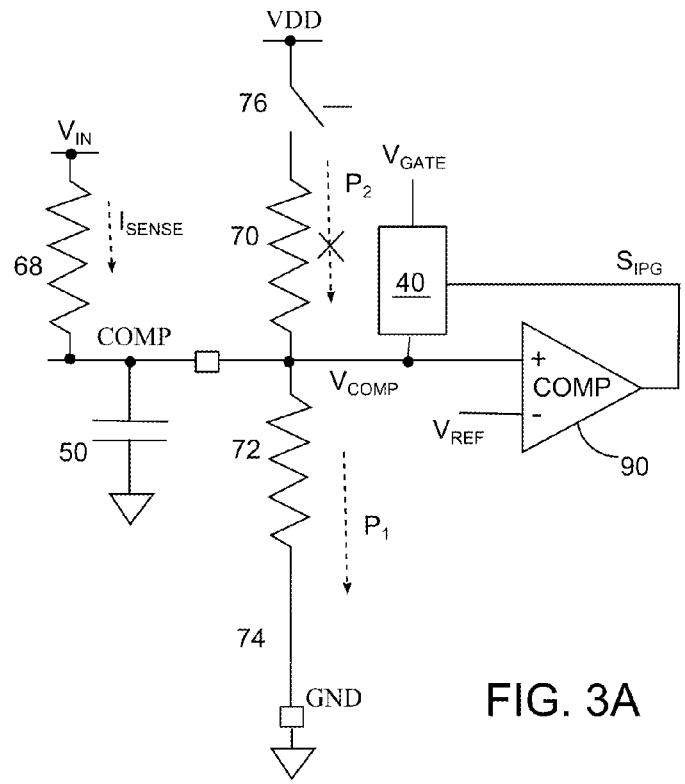
FIG. 3A shows some circuits in FIG. 2 during a startup procedure performing brownin detection.

FIG. 3A shows some circuits in FIG. 2 during a startup procedure performing brownin detection. A startup procedure begins when, for example, the switched mode power supply 41 is the first time connected to an AC mains outlet. At the beginning of the startup procedure, the controller 66 constantly turns OFF the power switch 34, the path switch 76 is OFF, and the path switch 74 is ON, as shown in FIG. 3A. Resistor 68 and detection resistor 72, shown in FIG. 3A, form a voltage divider, and the current $I_{SENSE}$ flowing therethrough determines the compensation voltage $V_{COMP}$. A comparator 90 in the controller 66 asserts input power good signal $S_{IPG}$ if the compensation voltage $V_{COMP}$ exceeds a predetermined reference voltage $V_{REF}$, to inform the PWM generator 40 that the input voltage $V_{IN}$ has exceeded a brownin voltage corresponding to the reference voltage $V_{REF}$. In one embodiment, during the startup procedure, only if the input voltage $V_{IN}$ has exceeded the brownin voltage for a certain period of time, then the controller 66 deems the input voltage as being high and stable enough for normal operation, and proceeds to soft start or normal operation. Before the input voltage $V_{IN}$ is deemed as being high and stable enough, PWM generator 40 constantly turns OFF the power switch 34.

Figure 3B:
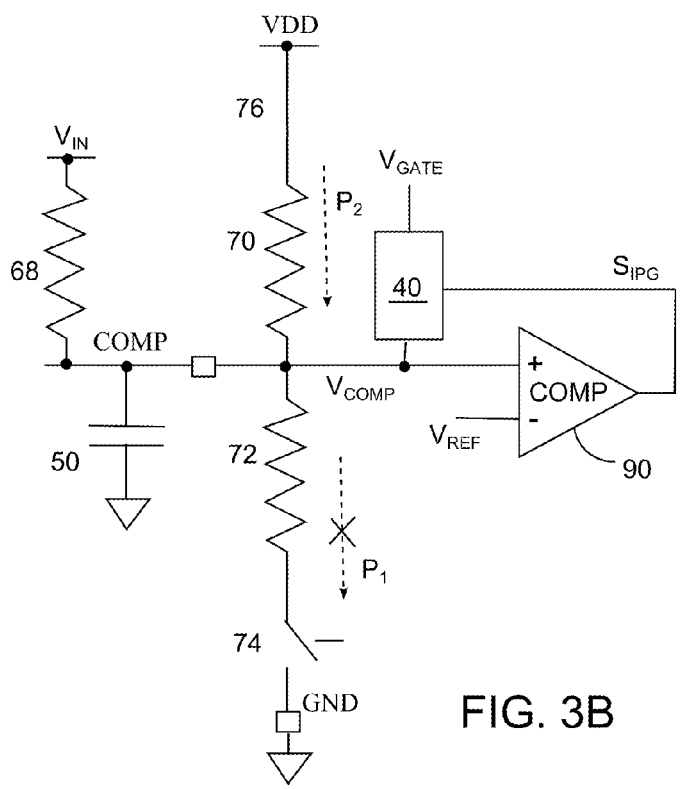
FIG. 3B shows some circuits in FIG. 2 during normal operation for output regulation.

FIG. 3B shows some circuits in FIG. 2 during normal operation for output regulation. Here in this specification, normal operation refers to the operation of the controller 66 when output voltage or current to the load 24 is properly regulated. As shown in FIG. 3B, the path switch 76 is ON, and the path switch 74 is OFF, such that the conduction path $P_2$ is provided and the conduction path $P_1$ is disconnected. The resistance of the resistor 68 is preferably much larger than that of the compensation resistor 70, such that the current passing through the resistor 68 could be negligible in comparison with that passing through the conduction path $P_2$. In some embodiments, the resistor 68 is tens of mega ohms and the compensation resistor 70 tens of kilo ohms, for example. Similar with the switched mode power supply 10 in FIG. 1, pin COMP in FIG. 3B, during normal operation, acts as an output node of an error amplifier, which uses the compensation capacitor 50 to accumulate the error between the output voltage $V_{OUT}$ and an expected target voltage by way of LT431 and some associated devices. During normal operation, the input power good signal $S_{IPG}$ is ignored and the PWM generator modulates the duty cycle of the PWM signal $V_{GATE}$ in response to the compensation voltage $V_{COMP}$, such that output voltage $V_{OUT}$ or output current could be well regulated.

In one embodiment, the compensation resistor 70 in FIGS. 3A and 3B could be replaced by a constant current source, which provides a current to charge the compensation capacitor 50 much more than the current provided by the resistor 68.

Figure 4:
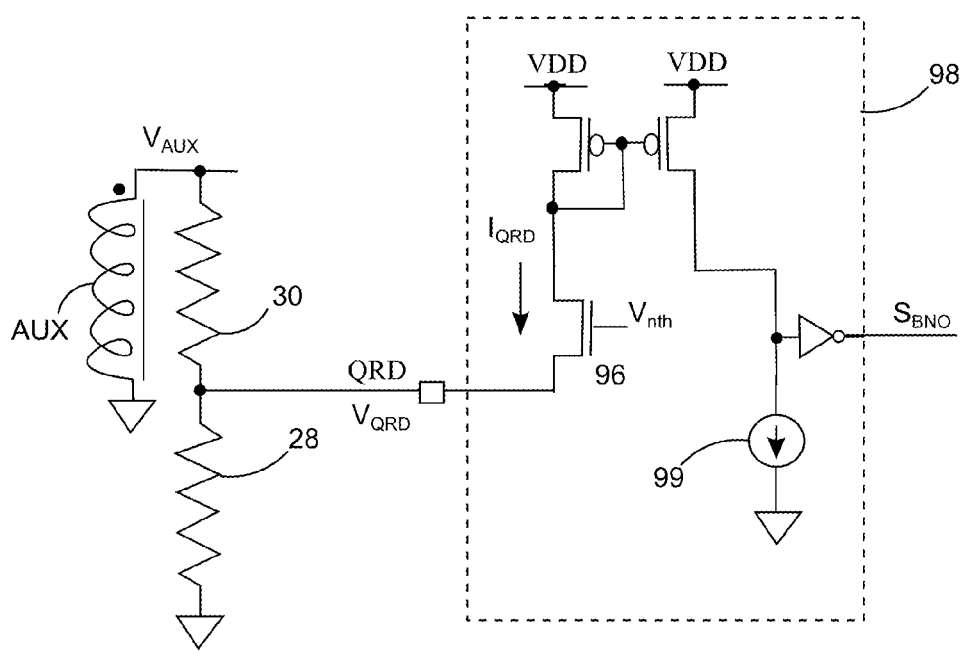
FIG. 4 demonstrates some circuits connected to pin QRD of FIG. 2 during normal operation for brownout detection.

A controller in some embodiments of the invention uses pin QRD to detect a brownout. FIG. 4 demonstrates some circuits connected to pin QRD of FIG. 2 during normal operation for brownout detection. A brownout detection circuit 98 in the controller 66 is connected to pin QRD, which is connected to the joint between the resistors 30 and 28. Please refer to both FIGS. 2 and 4, when the power switch 34 is ON during normal operation, the reflective voltage $V_{AUX}$ across the auxiliary winding AUX is negative and in proportion to the input voltage $V_{IN}$. NMOS 96 is used to clamp the quasi-resonance signal $V_{QRD}$ at pin QRD at about 0V when the reflective voltage $V_{AUX}$ is negative, such that the magnitude of clamping current $I_{QRD}$ is in proportion to the reflective voltage $V_{AUX}$ and the input voltage $V_{IN}$ as well. When the input voltage $V_{IN}$ is below a predetermined brownout voltage, the clamping current $I_{QRD}$ becomes too low, an output current generated by mirroring the clamping current $I_{QRD}$ becomes too small to pull up the input of the current source 99, and the brownout signal $S_{BNO}$ is accordingly asserted, indicating the occurrence of a brownout. The controller 66 could accordingly cease the power transferring of the switched mode power supply 41.

According to the aforementioned teaching, the pin COMP acts as a multifunction pin, according to which a brownin is detected during a startup procedure and the duty of PWM signal $V_{GATE}$ is modulated during normal operation. The switched mode power supply 41 in FIG. 2 is still capable of performing both brownin and brownout detection while having less pin count and resistors in comparison with that in FIG. 1. Accordingly, the switched mode power supply 41 could be less costly.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A switched mode power supply for generating a regulated output, comprising:
    an input power line and a ground line;
    an inductive device and a power switch, connected in series between the input power line and the ground line;
    a controller in an integrated circuit with a multifunction pin, configured for controlling the power switch;
    a resistor connected between the multifunction pin and the input power line;
    wherein the controller is configured for, during a startup procedure, providing a first conduction path conducting from the multifunction pin to the ground line; and
    wherein the controller is further configured for, during normal operation, disconnecting the first conduction path, and making the multifunction pin an output node of an error amplifier comparing the regulated output with a target value, to generate a PWM signal for controlling the power switch.

2. The switched mode power supply as claimed in claim 1, wherein the controller is configured for providing a second conduction path between an operation power line and the multifunction pin during the normal operation, and for disconnecting the second conduction path when the first conduction path is provided.

3. The switched mode power supply as claimed in claim 2, wherein the controller comprises:
    a compensation resistor and a path switch connected in series between the operation power line and the multifunction pin.

4. The switched mode power supply as claimed in claim 2, wherein the controller is further configured for generating an input power good signal in response to the current flowing through the first conduction path when the second conduction path is disconnected.

5. The switched mode power supply as claimed in claim 4, wherein the input power good signal indicates that an input voltage of the input power line exceeds a brownin voltage.

6. The switched mode power supply as claimed in claim 1, wherein the controller comprises:
    a detection resistor and a path switch connected in series between the multifunction pin and the ground line; and a comparator configured for comparing the voltage at the multifunction pin with a predetermined reference voltage to generate an input power good signal.

7. The switched mode power supply as claimed in claim 1, wherein the inductive device includes an auxiliary winding and a primary winding, the power switch connects the primary winding to the ground line, and the controller comprises:
   a quasi-resonance pin, connected to the auxiliary winding via a detection resistor; and
   a brownout detection circuit, configured for detecting, via the quasi-resonance pin and the detection resistor, a reflective negative voltage across the auxiliary winding when the power switch is turned ON, to determine an occurrence of a brownout.

8. A controller in an integrated circuit, used for a switched mode power supply with an inductive device and a power switch connected in series, the controller comprising:
   a multifunction pin, capable of being connected to an input power line through a resistor;
   a line voltage detector, configured for, during a startup procedure, providing a first conduction path from the multifunction pin to a ground line to discharge the multifunction pin; and
   an charge path provider, connected between an operation power line and the multifunction pin, and configured for providing the second conduction path to charge the multifunction pin during normal operation;
   wherein the first conduction path is disconnected during the normal operation, and the second conduction path is disconnected when the first conduction path is provided.

9. The controller as claimed in claim 8, further comprising a PWM generator configured to generate a PWM signal to the power switch in response to the compensation voltage at the multifunction pin during the normal operation.

10. The controller as claimed in claim 8, the charge path provider comprising a compensation resistor and a path switch connected in series between the operation power line and the multifunction pin.

11. The controller as claimed in claim 8, the line voltage detector comprising:
   a detection resistor and a path switch connected in series between the multifunction pin and the ground line;
   wherein the controller comprises a comparator configured for comparing the voltage at the multifunction pin with a predetermined reference voltage.

12. The controller as claimed in claim 8, wherein an input power good signal is generated in response to the current flowing through the first conduction path during the startup procedure, and the input power good signal represents the input voltage of the input power line has exceeded a brownin voltage.

13. The controller as claimed in claim 8, wherein the inductive device includes an auxiliary winding and a primary winding, the power switch connects the primary winding to the ground line, and the controller comprises:
   a quasi-resonance pin, capable of being connected to the auxiliary winding via a detection resistor; and
   a brownout detection circuit, configured for detecting, via the quasi-resonance pin and the detection resistor, a reflective negative voltage across the auxiliary winding when the power switch is turned ON, to determine an occurrence of a brownout.

14. A control method suitable for a switched mode power supply with an inductive device and a power switch connected in series between an input power line and a ground line, comprising:
   providing a multifunction pin to a controller in an integrated circuit:
   providing, in the controller, a first conduction path conducting from the multifunction pin to the ground line and generating an input power good signal in response to the current flowing through the first conduction path, wherein the input power good signal represents the input voltage of the input power line has exceeded a brownin voltage; and
   disconnecting the first conduction path, providing a second conduction path conducting between an operation power line and the multifunction pin, and generating a PWM signal to control the power switch in response to the voltage at the multifunction pin; and
   disconnecting the second conduction path when the first conduction path is provided.

15. The control method as claimed in claim 14, comprising:
   providing a compensation resistor and a path switch connected in series between the operation power line and the multifunction pin;
   turning off the path switch to disconnect the second conduction path.

16. The control method as claimed in claim 14, further comprising:
   providing a detection resistor and a path switch connected in series between the multifunction pin and the ground line;
   turning off the path switch to disconnect the first conduction path; and
   comparing a voltage at the multifunction pin with a predetermined reference voltage to generate the input power good signal.

17. The control method as claimed in claim 14, wherein the inductive device includes an auxiliary winding and a primary winding, the power switch connects the primary winding to the ground line, and the control method further comprises:
   providing a clamping current for clamping the voltage of a quasi-resonance pin when the power switch is turned ON; and
   determining an occurrence of a brownout when the clamping current is less than a predetermined value.

\* \* \* \* \*